United States Patent
Tabatake et al.

(10) Patent No.: US 11,869,421 B2
(45) Date of Patent: Jan. 9, 2024

(54) DISPLAY DEVICE

(71) Applicant: Japan Display Inc., Tokyo (JP)

(72) Inventors: Hiroshi Tabatake, Tokyo (JP); Tetsuo Morita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/656,265

(22) Filed: Mar. 24, 2022

(65) Prior Publication Data

US 2022/0319412 A1 Oct. 6, 2022

(30) Foreign Application Priority Data

Mar. 30, 2021 (JP) ................. 2021-057692

(51) Int. Cl.
| | | |
|---|---|---|
| G09G 3/3225 | (2016.01) | |
| H10K 59/131 | (2023.01) | |
| G09G 3/3258 | (2016.01) | |
| G09G 3/3233 | (2016.01) | |
| G09G 3/325 | (2016.01) | |
| G09G 3/3208 | (2016.01) | |

(52) U.S. Cl.
CPC ....... *G09G 3/3225* (2013.01); *H10K 59/1315* (2023.02); *G09G 3/325* (2013.01); *G09G 3/3208* (2013.01); *G09G 3/3233* (2013.01); *G09G 3/3258* (2013.01); *G09G 2310/061* (2013.01); *G09G 2330/02* (2013.01)

(58) Field of Classification Search
CPC .... G09G 3/3225; G09G 3/3233; G09G 3/325; G09G 3/3258; G09G 3/3208; G09G 2310/061; G09G 2330/02; H01L 27/3279; H10K 59/1315
See application file for complete search history.

(56) References Cited

U.S. PATENT DOCUMENTS

| | | | | |
|---|---|---|---|---|
| 2008/0238836 A1* | 10/2008 | Uchino | ............... | G09G 3/3233 345/76 |
| 2010/0149153 A1* | 6/2010 | Yamamoto | ........... | G09G 3/3233 345/214 |
| 2014/0111404 A1* | 4/2014 | Omata | ............... | H10K 59/1216 345/76 |
| 2017/0213506 A1* | 7/2017 | Shibusawa | ........... | G09G 3/3266 |
| 2018/0145126 A1* | 5/2018 | Sato | .................... | H01L 27/1251 |
| 2019/0108789 A1* | 4/2019 | Tsuge | ................... | G09G 3/3233 |
| 2019/0229177 A1* | 7/2019 | Kim | ..................... | G09G 3/3275 |
| 2021/0280641 A1* | 9/2021 | Bang | ................... | H01L 51/5253 |

FOREIGN PATENT DOCUMENTS

JP 2008-135325 A 6/2008

* cited by examiner

*Primary Examiner* — Insa Sadio
*Assistant Examiner* — Saifeldin E Elnafia
(74) *Attorney, Agent, or Firm* — Maier & Maier, PLLC (57) ABSTRACT

According to one embodiment, a display device includes a base, a plurality of pixels, a power supply line and a power supply line drive circuit. The pixels each include a pixel circuit, a display element including a lower electrode, an upper electrode and an organic layer including a light-emitting layer. The upper electrode is connected to the power supply line that provides a predetermined potential to the upper electrode. The power supply line drive circuit supplies, to the power supply line, a first potential to the upper electrode during a light-emitting period and supplies, to the power supply line, a second potential to the upper electrode during a non-light-emitting period.

6 Claims, 5 Drawing Sheets

DISPLAY DEVICE

CROSS-REFERENCE TO RELATED APPLICATIONS

This application is based upon and claims the benefit of priority from Japanese Patent Application No. 2021-057692, filed Mar. 30, 2021, the entire contents of which are incorporated herein by reference.

FIELD

Embodiments described herein relate generally to a display device.

BACKGROUND

In recent years, display devices in which an organic light-emitting diode (OLED) is applied as a display element have been used in practical applications. Such display devices comprise an organic layer between the pixel electrode and the common electrode. The organic layer includes functional layers such as a hole transport layer and an electron transport layer in addition to the light-emitting layer.

While the practical use of display devices in which organic light-emitting diodes are applied is progressing, such display devices entail the problem that it is difficult to achieve high definition.

DETAILED DESCRIPTION

In general, according to one embodiment, a display device comprises a base, a plurality of pixels arranged in a matrix on the substrate, a power supply line connected to each of the pixels and a power supply line drive circuit connected to the power supply line, and the pixels each include a pixel circuit disposed on the base, a display element including a lower electrode connected to the pixel circuit, an upper electrode disposed to oppose the lower electrode and an organic layer including a light-emitting layer disposed between the lower electrode and the upper electrode, and the upper electrode is connected to the power supply line that provides a predetermined potential to the upper electrode, and the power supply line drive circuit supplies, to the power supply line, a first signal that provides a first potential to the upper electrode during a light-emitting period in which the light-emitting layer emits light and supplies, to the power supply line, a second signal that provides a second potential different from the first potential to the upper electrode during a non-light-emitting period in which the light-emitting layer does not emit light.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

In some of the embodiments, a display device DSP is an organic electroluminescent display comprising an organic light-emitting diode (OLED) as the display element, which can be installed in television sets, personal computers, mobile terminals, cell phones and the like. Note that the display elements described below can be applied as a light-emitting element in an illumination device, and the display device DSP can be diverted to other electronic devices such as illumination devices.

Figure 1:
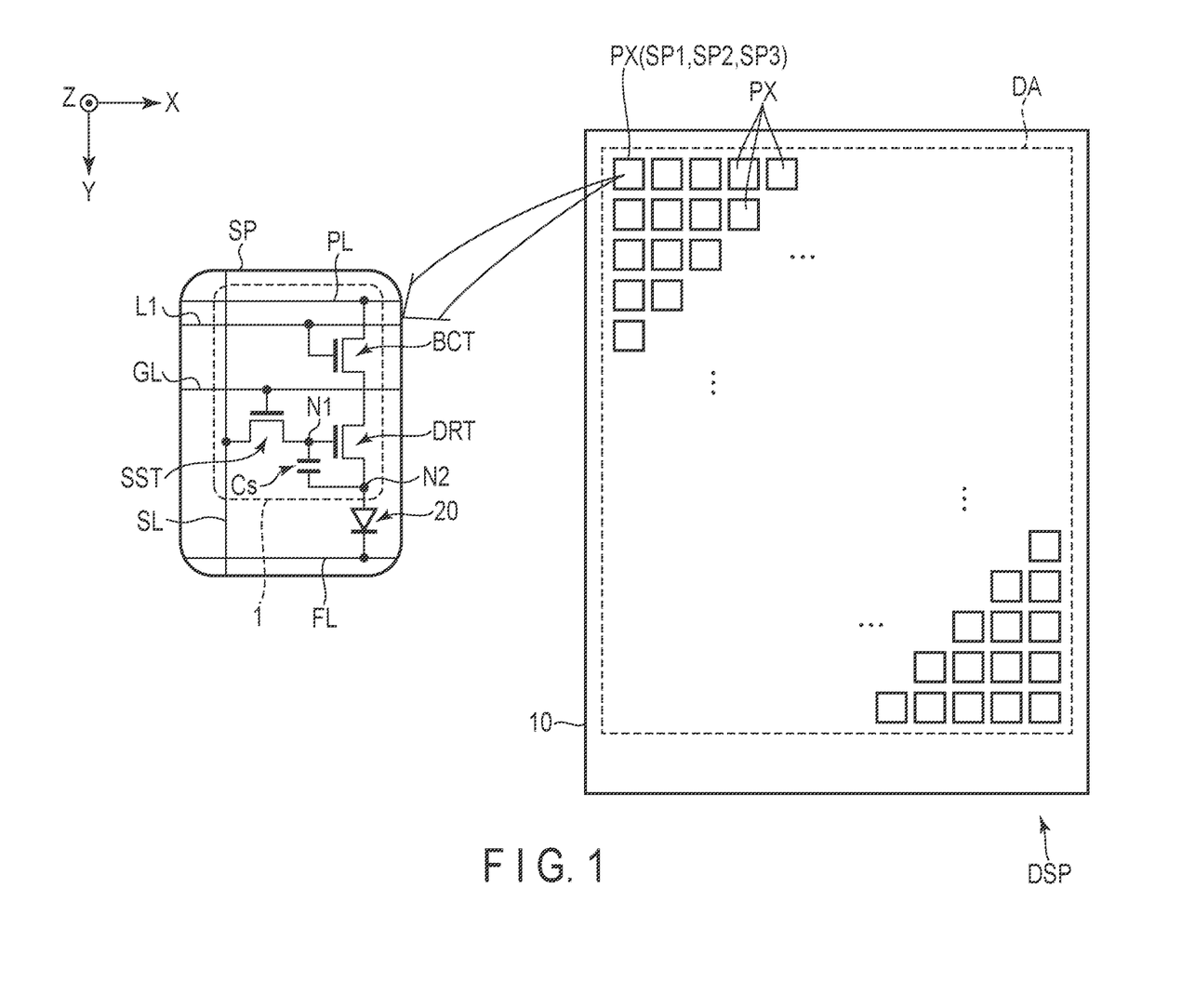
FIG. 1 is a diagram showing a configuration example of a display device according to an embodiment.

FIG. 1 is a diagram showing a configuration example of the display device DSP according to this embodiment. The display device DSP comprises a display unit DA that displays images, on an insulating base 10. The base 10 may be glass or a flexible resin film.

The display unit DA comprises a plurality of pixels PX arranged in a matrix along the first direction X and the second direction Y. The pixels PX each comprises a plurality of subpixels SP1, SP2 and SP3. For example, the pixel PX comprises a red subpixel SP1 (a first subpixel), a green subpixel SP2 (a second subpixel) and a blue subpixel SP3 (a third subpixel). Note that besides the three-color subpixels mentioned above, the pixel PX may comprise four or more subpixels of other colors such as white and the like.

A configuration example of one subpixel SP contained in the pixel PX will now be briefly described.

The subpixel SP comprises a pixel circuit 1 and a display element 20 that is driven and controlled by the pixel circuit 1. The pixel circuit 1 comprises a pixel selection switch SST, a drive transistor DRT, an output switch BCT and a capacitor Cs. The pixel selection switch SST, the drive transistor DRT and the output switch BCT are switch elements formed from thin-film transistors (TFTs), for example, which include a gate electrode, a source electrode and a drain electrode, respectively.

In the pixel selection switch SST, the gate electrode is connected to a scanning line GL, the source electrode is connected to a signal line SL, and the drain electrode is connected to a node N1. The node N1 is connected to the drain electrode of the pixel selection switch SST, the gate electrode of the drive transistor DRT, and one of the electrodes which constitutes the capacitor Cs. When the pixel selection switch SST is turned on in response to the scanning signal supplied from the scanning line GL, it captures the video signal supplied from the signal line SL.

In the drive transistor DRT, the gate electrode is connected to the node N1, the source electrode is connected to the drain electrode of the output switch BCT, and the drain electrode is connected to a node N2. The node N2 is connected to the drain electrode of the drive transistor DRT, the other electrode that constitutes the capacitor Cs, and an anode of the display device 20. The drive transistor DRT outputs a drive current of a current amount according to the video signal described above, to the display element 20.

In the output switch BCT, the gate electrode is connected to an output control signal line L1, the source electrode is connected to a power line PL, and the drain electrode is connected to the source electrode of the drive transistor DRT. The output switch BCT is a switch to control the period of emission of the light which the display element 20 emits.

The cathode of the display element 20 is connected to a power supply line FL. Note that the configuration of the pixel circuit 1 is not limited to that of the example illustrated.

The display element 20 is an organic light-emitting diode (OLED), which is a light-emitting element. For example, the subpixel SP1 comprises a display element that emits light corresponding to a wavelength of a red color, the subpixel SP2 comprises a display element that emits light corresponding to a wavelength of a green color, and the subpixel SP3 comprises a display element that emits light corresponding to a wavelength of a blue color. With multiple subpixels SP1, SP2, and SP3 with different display colors provided in the pixel PX, it is possible to realize multiple color display.

Note, however, the display elements 20 of the subpixels SP1, SP2 and SP3 may be configured to emit light of the same color. In this way, monochromatic display can be realized.

Further, when the display elements 20 of the subpixels SP1, SP2 and SP3 may be configured to emit white light, a respective color filter may be placed to oppose each display element 20. For example, the subpixel SP1 comprises a red color filter opposing the display element 20, the subpixel SP2 comprises a green color filter opposing the display element 20, and the subpixel SP3 comprises a blue color filter opposing the display element 20. With this configuration, it is possible to realize multi-color display.

When the display elements 20 of the subpixels SP1, SP2 and SP3 are configured to emit ultraviolet light, a photo-conversion layer should be disposed to oppose the display element 20, and thus multi-color display can be realized.

Figure 2:
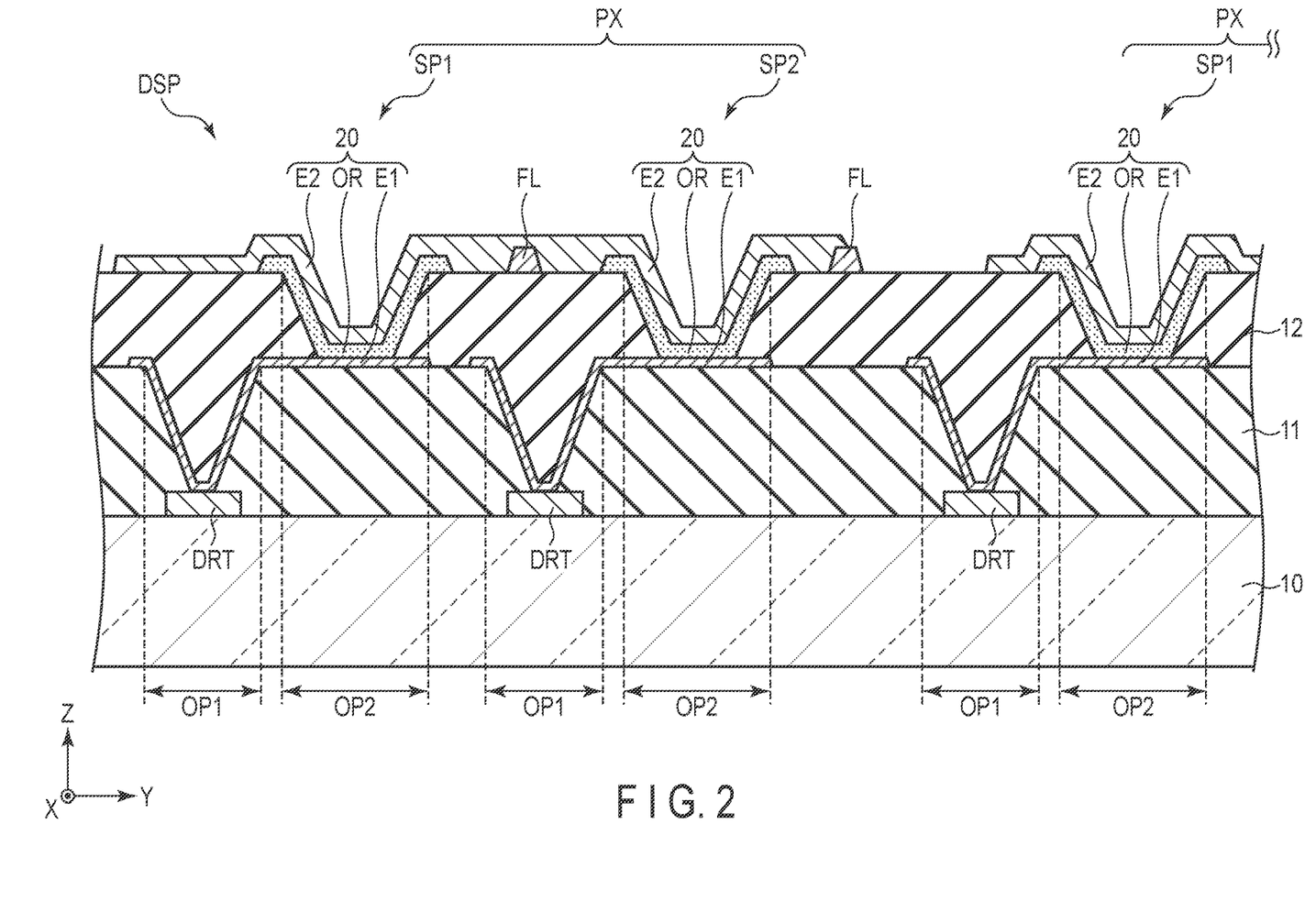
FIG. 2 is a cross-sectional view of a configuration example of subpixels shown in FIG. 1.

FIG. 2 is a cross-sectional view showing a configuration example of the subpixels SP (display elements 20) shown in FIG. 1.

The pixel circuit 1 shown in FIG. 1 is placed on the base 10 and covered by an insulating layer 11. FIG. 2 shows only the drive transistor DRT contained in the pixel circuit 1 in a simplified form. The insulating layer 11 is equivalent to an underlying base layer of the display element 20, and is made of, for example, an insulating material such as polyimide, acrylic resin, silicon nitride (SiN), silicon oxide (SiO) or the like.

The display element 20 comprises a lower electrode E1, an organic layer OR and an upper electrode E2. The organic layer OR is disposed to be sandwiched between the lower electrode E1 and the upper electrode E2.

The lower electrode E1 is an electrode provided for each subpixel or each display element, and is electrically connected to the drive transistor DRT. The lower electrode E1 with such a configuration may be, in some cases, referred to as a pixel electrode, reflective electrode, anode or the like.

The upper electrode E2 is an electrode arranged for those pixels arranged in each row. In other words, the upper electrode E2 is an electrode provided over a plurality of pixels PX adjacent to each other along the first direction X. In FIG. 2, it is assumed that those pixels PX located on the left side of the figure and those pixels PX located on the right side are pixels located in different pixel rows. With this arrangement, the upper electrode E2 is divided between these pixels PX, and between these pixels PX, there are certain spaces where the upper electrode E2 does not exist. The upper electrode E2 with such a configuration may be, in some cases, referred to as a common electrode, counter electrode, cathode or the like.

The upper electrode E2 is connected to the power supply line FL. The power supply line FL is a wiring line to provide a predetermined potential to the upper electrode E2. In more detail, the power supply line FL is a wiling line to supply signals to set the potential of the upper electrode E2 to a common potential (a first potential) or a reset potential (a second potential) different from the common potential. Note that the power supply line FL is disposed between two adjacent organic layers OR, and has a role of dividing these organic layers OR from each other.

The lower electrode E1 is placed on the insulating layer 11 and is connected to the drive transistor DRT via an opening OP1 formed in the insulating layer 11. The opening OP1 is a through-hole formed in the area overlapping the drive transistor DRT and penetrating the insulating layer 11 to the drive transistor DRT.

The lower electrode E1 is a transparent electrode formed of, for example, a transparent conductive material such as indium tin oxide (ITO), indium zinc oxide (IZO) or the like. The lower electrode E1 may be a metal electrode formed of a metallic material such as silver (Ag), aluminum (Al), titanium (Ti), molybdenum (Mo), tungsten (W) or the like. The lower electrode E1 may also be of a stacked structure of a transparent electrode and a metal electrode. For example, the lower electrode E1 may be configured as a stacked body consisting of a transparent electrode, a metal electrodes and a transparent electrodes stacked in this order, or may be configured as a stacked body consisting of three or more layers.

An insulating layer 12 is provided on the insulating layer 11 to cover the lower electrode E1. The insulating layer 12 comprises an opening OP2, and a part of the lower electrode E1 is exposed in the opening OP2.

The organic layer OR is connected to the lower electrode E1 via the opening OP2. In this embodiment, the organic layer OR includes a light-emitting layer that emits light in one of the colors red, green, or blue. The organic layer OR may include, in addition to the light-emitting layer, functional layers such as a hole injection layer, a hole transport layer, an electron blocking layer, a hole blocking layer, an electron transport layer, an electron injection layer, and the like. For this reason, the organic layer OR may be of a stacked body in which a plurality of layers including at least one of the functional layers listed above are stacked, in addition to the light-emitting layer, though FIG. 2 illustrates the organic layer OR as a single layer.

The power supply line FL is disposed on the insulating layer 12.

FIG. 2 shows an example case where the power supply line FL is placed between the organic layer OR of the subpixel SP1 contained in a pixel PX and the organic layer OR of the subpixel SP2 adjacent to the subpixel SP1, so as to partition these two organic layers OR from each other. Further, FIG. 2 shows an example case where the power supply line FL is located as well between a pixel PX and another pixel PX adjacent to the pixel PX (a pixel PX in a pixel row different from that of the pixel PX), so as to partition the organic layer OR contained in the pixel PX (the organic layer OR contained in the subpixel SP2 of the pixel PX) and the organic layer OR contained in another adjacent pixel PX (the organic layer OR contained in the subpixel SP1 of another adjacent pixel PX). Thus, the pixels PX and the subpixels SP1, SP2 and SP3 contained in each pixel PX are partitioned from each other by the respective power supply lines FL.

The power supply line FL is made of, for example, a low-resistance metal material such as silver (Ag), aluminum (Al), titanium (Ti), molybdenum (Mo), tungsten (W) or the like. The power supply line FL may be a single layer formed of one of the metal materials listed above, or it may be a stacked body in which some of the metal materials mentioned above are stacked one on another.

The upper electrode E2 is a common layer disposed over those pixels PX disposed adjacent to each other along the first direction X, to covers the insulating layer 12 and the organic layer OR contained in each of these pixels PX, and is connected to the power supply line FL.

The upper electrode E2 is a transparent electrode formed of a transparent conductive material such as ITO or IZO. The upper electrode E2 may be a semi-transparent metal electrode formed of a metal material such as magnesium (Mg), silver (Ag), aluminum (Al) or the like.

When the potential of the lower electrode E1 is relatively higher than that of the upper electrode E2, the lower electrode E1 is equivalent to the anode and the upper electrode E2 is equivalent to the cathode. When the potential of the upper electrode E2 is relatively higher than that of the lower electrode E1, the upper electrode E2 is equivalent to the anode and the lower electrode E1 is equivalent to the cathode.

In this embodiment, such an example case is assumed, where the lower electrode E1 is equivalent to the anode and the upper electrode E2 is equivalent to the cathode.

According to the configuration shown in FIG. 2, the light-emitting area of the display device 20 can be formed in the area where the organic layer OR disposed between the lower electrode E1 in the opening OP2 and the upper electrode E2 placed as the common layer is located. However, the portion of the organic layer OR, which is disposed between the slope of the opening OP2 and the upper surface of the insulating layer 12 does not substantially emits light because the insulating layer 12 intervenes between the lower electrode E1 and the upper electrode E2.

Figure 3:
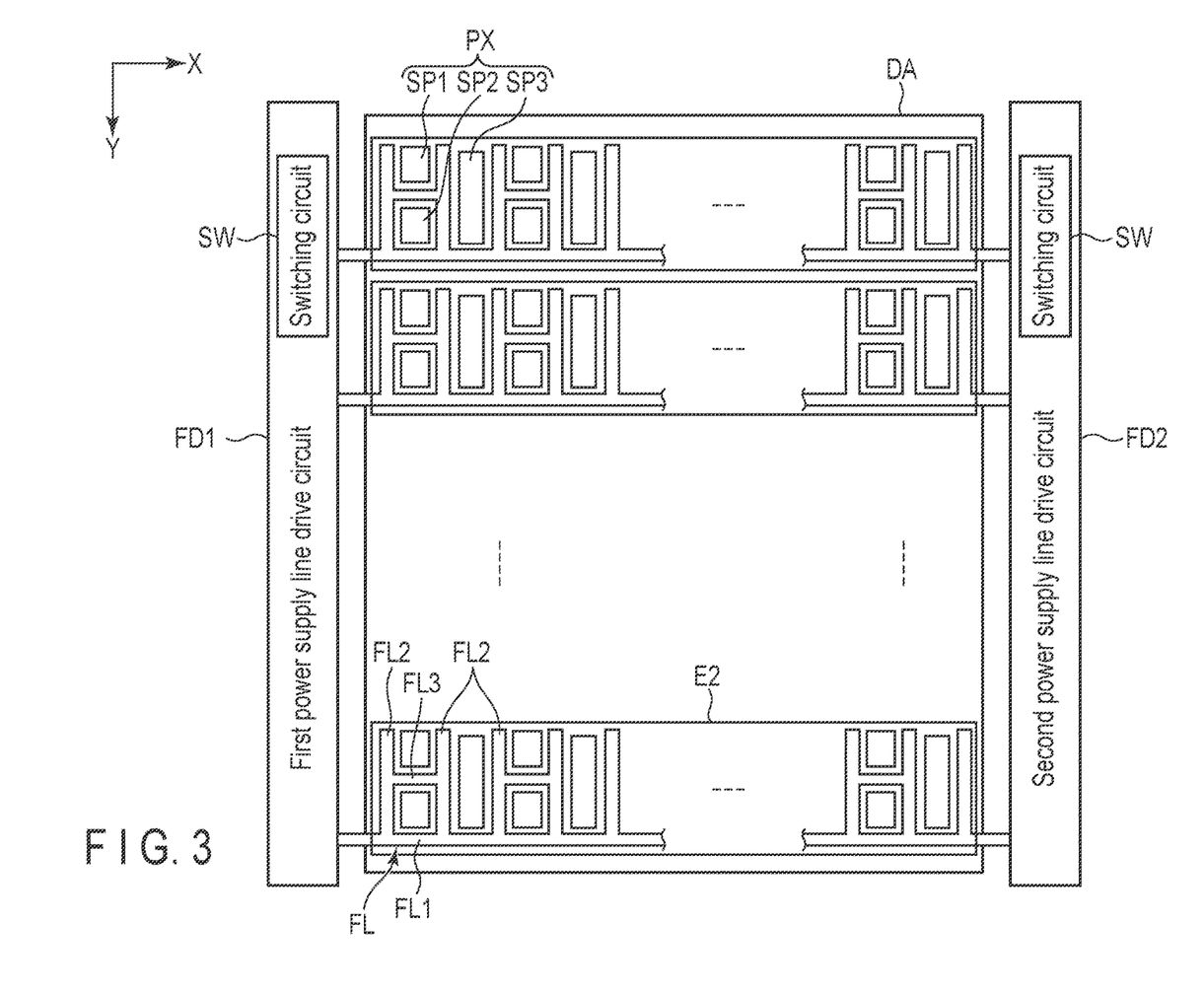
FIG. 3 is a plan view of subpixels, power supply lines and power supply line drive circuits.

FIG. 3 is a plan view showing the subpixels SP1, SP2 and SP3 contained in the pixels PX, the power supply lines FL, and the power supply line drive circuit FD connected to the power supply lines FL.

The sub-pixels SP1, SP2 and SP3 contained in one pixel PX are each formed into a rectangular shape extending along the second direction Y in the display area DA. The sub-pixel SP1, which comprises a display element that emits light corresponding to the red wavelength and the subpixel SP2, which comprises a display element that emits light corresponding to the green wavelength, are arranged to be adjacent to each other along the second direction Y. Further, the subpixels SP1 and SP2, and the subpixel SP3, which comprises a display element that emits light corresponding to the blue wavelength, are arranged to be adjacent to each other along the first direction X. The size of the subpixels SP1 and SP2 (the area in the X-Y plane) is smaller than that of subpixel SP3.

FIG. 3 illustrates the example case where the subpixels SP1, SP2 and SP3 are arranged in penta-tile fashion, but the arrangement mode of the subpixels SP1, SP2 and SP3 is not limited to this. The subpixels SP1, SP2 and SP3 may be arranged in a stripe mode, for example.

Each power supply lines FL is provided for pixels of each row. Each power supply line FL supplies signals to set the potential of the upper electrodes E2 connected thereto, to the common potential or the reset potential. Each power supply line FL partitions the pixels PX from each other and the subpixels SP1, SP2 and SP3 contained in each pixel PX from each other.

Here, the shape of the power supply lines FL will now be explained in detail. As shown in FIG. 3, each power supply line FL includes a first portion FL1, a second portion FL2 and a third portion FL3. The first portion FL1 is located between two adjacent pixel rows and extends along the first direction X. The second portion FL2 is located between each adjacent pair of pixels PX aligned along the first direction X, and between the subpixels SP1 and SP2 and the subpixel SP3 contained in each pixel PX, and branches off from the first portion FL1 and along the second direction Y. The third portion FL3 is a portion extending in the first direction X to connect the two second portions FL2. With the power supply lines FL thus formed into the shape described above, the pixels PX and the subpixels SP1, SP2 and SP3 contained in each pixel PX are partitioned from each other.

Both ends of each power supply line FL are connected to the first power supply line drive circuit FD1 and the second power supply line drive circuit FD1 and FD2, respectively. FIG. 3 shows an example case where both ends of each power supply line FL are connected to the first power supply line drive circuit FD1 and the second power supply line drive circuit FD2, respectively, but the configuration is not limited to this case. Note that it suffices if at least one end of each power supply line FL is connected to one of the first power supply line drive circuit FD1 and the second power supply line drive circuit FD2.

The first power supply line drive circuit FD1 and the second power supply line drive circuit FD2 supply signals for setting the potential of the upper electrode E2 to the common potential or the reset potential to each power supply line FL sequentially in a time-division manner. The first power supply line drive circuit FD1 and the second power supply line drive circuit FD2 each comprise a switching circuit SW. The switching circuit SW is used to switch to allow the first power supply line drive circuit FD1 and the second power supply line drive circuit FD2 to supply a signal (the first signal) to set the potential of the upper electrode E2 to the common potential to the respective power supply line FL, or to supply a signal (the second signal) to set the potential of the upper electrode E2 to the reset potential (more specifically, to supply the signal to set the potential of the node N2 shown in FIG. 1 to the reset potential via the upper electrode E2 to the power supply line FL).

During the light-emitting period in which the organic layers OR (the light-emitting layers) of the subpixels SP1, SP2 and SP3 are emitting light, the switching circuit SW controls the operation of the first power supply line drive circuit FD1 and the second power supply line drive circuit FD2 so that the signals to set the potential of each upper electrode E2 to the common potential are sequentially supplied to each respective power supply line FL. On the other hand, during the period between the above-described light-emitting period and the next light-emitting period (that is, a non-light-emitting period), the switching circuit SW controls the operation of the first power supply line drive circuit FD1 and the second power supply line drive circuit FD2 so that the signals to set the potential of the upper electrode E2 (the potential of the node N2) to the reset potential are sequentially supplied to each respective power supply line FL. During the non-light-emitting period, the potential of the node N2 is set to the reset potential via the upper electrode E2 and the lower electrode E1, and thus a black screen can be inserted. Thus, it is possible to reset the effects of the previous light-emitting period, thereby improving the display quality.

Here, the effect of this embodiment will be described using the comparative example shown in FIG. 4. The comparative example is intended to illustrate some of the effects that can be achieved by this embodiment, and does not exclude the effects that are common to the comparative example and the present embodiment from the scope of the present embodiment.

Figure 4:
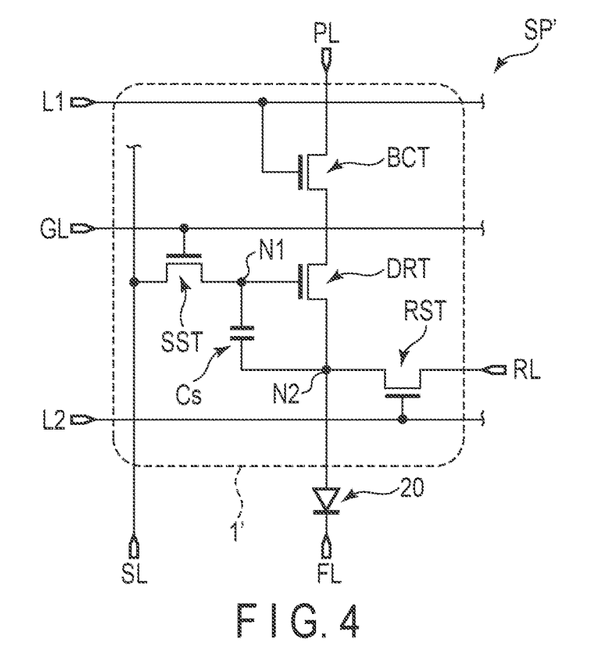
FIG. 4 is an equivalent circuit diagram showing a configuration example of a subpixel according to a comparative example.

FIG. 4 is an equivalent circuit diagram illustrating a configuration example of a subpixel SP' according to the comparative example. As shown in FIG. 4, the subpixel SP' comprises a pixel circuit 1' and a display element 20. The pixel circuit 1' comprises a pixel selection switch SST, a drive transistor DRT, an output switch BCT, a capacitor Cs and a reset switch RST. The pixel selection switch SST, the drive transistor DRT, the output switch BCT and the reset switch RST are switch elements formed from thin-film transistors (TFTs), and each includes a gate electrode, a source electrode and a drain electrode.

The subpixel SP' of the comparative example is different from the subpixel SP of this embodiment in that the pixel circuit 1' comprises a reset switch RST.

In the reset switch RST, the gate electrode is connected to the reset control signal line L2, the source electrode is connected to the reset power line RL, and the drain electrode is connected to the node N2. When the reset switch RST is turned on in response to the control signal supplied from the reset control signal line L2, the potential of the node N2 is set to the reset potential given by the reset power supply line RL, to be reset.

In the configuration of the comparative example, as shown in FIG. 4, the reset switch RST is provided in each subpixel SP' as a configuration to reset the potential of the node N2. Further, in the configuration of the comparative example, as shown in FIG. 4, a reset control signal line L2 is provided for each pixel row to control the turning on/off of the reset switch RST. Furthermore, in the configuration of the comparative example, a reset power line RL is provided to reset the potential of the node N2. Since these elements are provided for each subpixel SP' or each pixel row as described above, the number of these elements increases as the display device becomes more and more high-definition. Here, it is considered that when a certain number of elements exceeds, the arrangement of the members becomes very difficult due to space limitations. Therefore, the configuration of the comparative example entails the problem that it is difficult to achieve a higher definition of the display device.

By contrast, in the display device DSP of this embodiment, the power supply line FL functions as the reset power line RL in the comparative example as well, and thus it is possible to omit the reset power line RL to be provided. Measures to achieve this are that a switching circuit SW that can switch the operation of the first power supply line drive circuit FD1 and the second power supply line drive circuit FD2 so that in the light-emitting period, the signal to set the potential of the upper electrode E2 to the common potential, is supplied to the power supply line FL, and in the non-light-emitting period, the signal to set the potential of the node N2 to the reset potential via the upper electrode E2 and the lower electrode E1 is supplied to the power supply line FL.

Further, in the display device DSP of this embodiment, the upper electrode E2 and the power supply line FL are provided for each pixel row, it is possible to supply the reset potential sequentially to each pixel row without providing the reset switch RST and the reset control signal line L2 of the comparative example. For example, when the upper electrode E2 is placed over all pixels PX (subpixels SP), instead of the pixels of each row, and the power supply line FL is made to function as the reset power supply line RL, all pixels PX are displayed in black at the same time, resulting in a decrease in contrast and the like. Thus, the display quality further degrades. However, in the configuration of this embodiment, the upper electrode E2 and the power supply line FL are provided for each pixel row, and therefore it is possible to omit the arrangement of the reset switch RST and the reset control signal line L2 without causing the display quality to deteriorate as in the comparative example.

Figure 5:
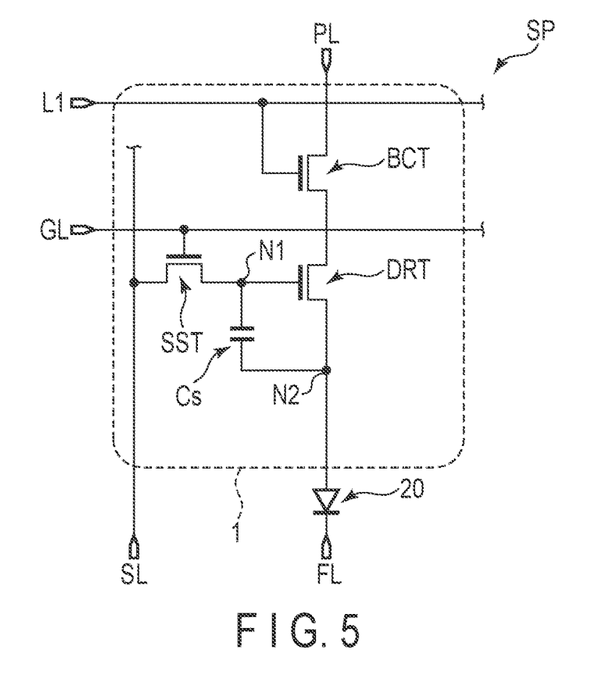
FIG. 5 is an equivalent circuit diagram showing a configuration example of a subpixel of this embodiment.

As explained above, the subpixels SP of the display device DSP of this embodiment has the configuration shown in FIG. 5, the reset power line RL, the reset switch RST and the reset control signal line L2 can be omitted as compared to the configuration of the comparative example shown in FIG. 4. According to this configuration, the space for the other wiring members can be freed by the extent that the reset power line RL, the reset switch RST and the reset control signal line L2 are not placed, thus making it possible to achieve higher resolution in the display device DSP.

Note that, as shown in FIG. 2, the power supply line FL is placed on the same layer as the organic layer OR. In general, the reset power line RL, the reset switch RST and the reset control signal line L2, mentioned above, and further, various types of wiring lines such as the scanning lines GL and signal lines SL, and various types of switch elements, are, in many cases, provided in the layer where the drive transistor DRT (the pixel circuit 1) and the like are placed, which is referred to as a wiring layer. By contrast, in this embodiment, the power supply line FL is placed not in the wiring layer as described above, but in the same layer as that of the organic layer OR. In this respect as well, it is possible to free up a space for the other wiring members to be placed, and thus a higher resolution in the display device DSP can be achieved.

Further, in this embodiment, the power supply line FL formed of a low-resistance metal material is provided in each pixel row and connected to each upper electrode E2 disposed in each pixel row. Thus, the resistance of each upper electrode E2 can be lowered.

Furthermore, in this embodiment, since the power supply line FL has such a shape as shown in FIG. 3, and it can play the role of partitioning the pixels PX and the subpixels SP1, SP2 and SP3 contained in each pixel PX from each other.

Figure 6:
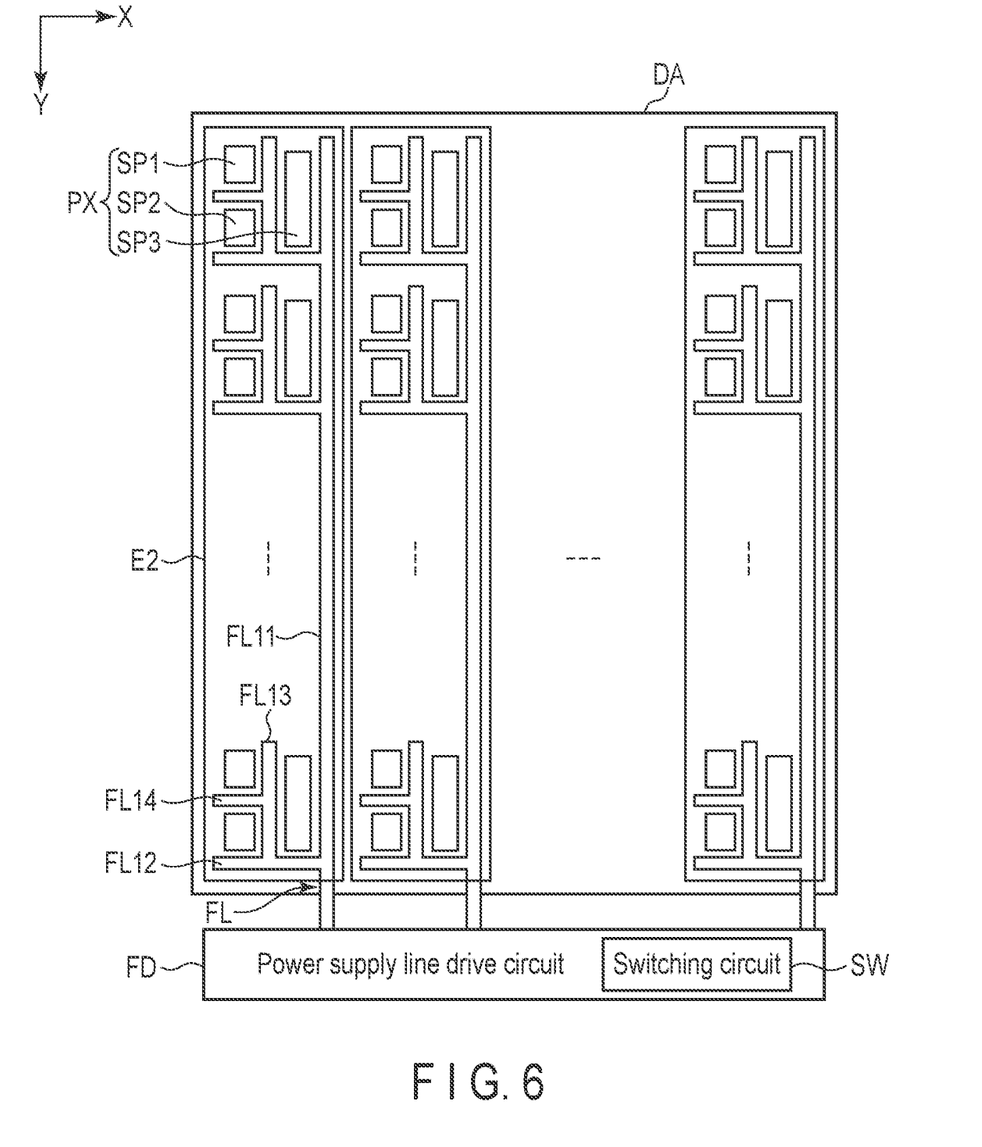
FIG. 6 is a plan view of subpixels, power supply lines and power supply line drive circuits of this embodiment.

In this embodiment, FIG. 3 shows such a configuration that the upper electrode E2 and the power supply line FL are provided in each pixel row, but the configuration is not limited to this. For example, as shown in FIG. 6, the upper electrode E2 and the power supply line FL can be arranged in each pixel column. In the following descriptions, the shape of the power supply line FL when the upper electrode E2 and the power supply line FL are arranged in each pixel column will be described.

As shown in FIG. 6, those power supply lines FL which are provided in each pixel column each include a first portion FL1 1, a second portion FL12, a third portion FL 13 and a fourth portion FL14. The first portion FL11 is located between two adjacent pixel columns and extends along the second direction Y. The second portion FL12 is located between each adjacent pair of pixels PX aligned along the second direction Y and branches off from the first portion FL11 to extend in the first direction X. The third portion FL13 is located between the subpixels SP1 and SP2 and the subpixel SP3 contained in each pixel PX, and branches off from the second portion FL12 to extend in the second direction Y. The fourth portion FL14 is located between the subpixel SP1 and the subpixel SP3 contained in each pixel PX and branches off from the third portion FL13 to extend in the first direction Y. Each power supply line FL has such a shape, and therefore if the power supply lines FL are provided in each pixel column, the pixels PX and the subpixels SP1, SP2 and SP3 contained in each pixel PX can be portioned from each other.

As shown in FIG. 6, one end of each power supply line FL is connected to the power supply line drive circuit FD. The configuration and functions of the power supply line drive circuit FD are the same as those of the first power supply line drive circuit FD1 and the second power supply line drive circuit FD2 shown in FIG. 3, and therefore a detailed description thereof will be omitted here.

In the configuration shown in FIG. 6 as well, the upper electrode E2 is disposed to be divided and a plurality of power supply lines FL2 are provided to be connected to the respective portions of the upper electrode E2 as in the configuration shown in FIG. 3. Similarly, the power supply line drive circuit FD includes a switching circuit SW that can switch whether to supply the signal to set the potential of the upper electrode E2 to the common potential to the power supply line FL or to supply the signal to set the potential of the node N2 to the reset potential to the power supply line FL. Therefore, advantageous effects similar to those of the configuration shown in FIG. 3 can be obtained. That is, the reset power line RL, the reset switch RST and the reset control signal line L2 in the comparative example of FIG. 4 can be omitted, and therefore, it is possible to achieve higher resolution of the display device DSP.

According to the embodiment described above, the power supply line FL can be used as a wiring line to supply the signal to set the potential of the upper electrode E2 to the common potential and set the potential of the upper electrode E2 to the reset potential, as well, and thus the configuration related to the resetting to insert a black screen during the non-light-emitting period can be omitted, making it possible to achieve higher definition of the display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a base;
a plurality of pixels arranged in a matrix on the base;
a power supply line connected to each of the pixels; and
a power supply line drive circuit connected to the power supply line,
the pixels each comprising:
a pixel circuit disposed on the base, and
a display element including a lower electrode connected to the pixel circuit, an upper electrode disposed to oppose the lower electrode and an organic layer including a light-emitting layer disposed between the lower electrode and the upper electrode,
the upper electrode being connected to the power supply line that provides a predetermined potential to the upper electrode, and
the power supply line drive circuit supplying, to the power supply line, a first signal that provides a first potential to the upper electrode during a light-emitting period in which the light-emitting layer emits light, and supplying, to the power supply line, a second signal that provides a second potential different from the first potential to the upper electrode during a non-light-emitting period in which the light-emitting layer does not emit light, wherein
the upper electrode and the power supply line are arranged in each of columns of the pixels,
the power supply line drive circuit supplies the first signal to the power supply line sequentially in a time-division manner during the light-emitting period, and supplies the second signal to the power supply line sequentially in a time-division manner during the non-light-emitting period,
the pixel each include a first subpixel which emits red light, a second subpixel which emits green light, and a third subpixel which emits blue light,
the power supply line is arranged between two pixels adjacent to each other and in a portion that is adjacent to other subpixels of a circumference of each of the first, second, and third subpixels included in each pixel, and is not arranged in a portion that is not adjacent to the other subpixels of the circumference of each of the first, second, and third subpixels included in each pixel, and
the power supply line is disposed on an insulating layer, which covers an end portion of the lower electrode and is arranged to partition the pixels and the first, second, and third subpixels included in each pixel, from each other.

2. The display device of claim 1, wherein
the non-light-emitting period is a period between one light-emitting period and a next light-emitting period.

3. The display device of claim 1, wherein
the first potential is a common potential for causing the light-emitting layer to emit light, and
the second potential is a reset potential for resetting the common potential provided in the light-emitting period.

4. The display device of claim 1, wherein
the pixels each display a black screen during the non-light-emitting period based on the second signal supplied to the power supply line.

5. The display device of claim 1, wherein
the power supply line is disposed in a same layer as that of the organic layer, which is a different from a layer in which the pixel circuit is disposed.
6. The display device of claim 1, wherein
the power supply line is formed of a low-resistance metal material.

\* \* \* \* \*